(12) United States Patent
Kim et al.

(10) Patent No.: US 12,013,444 B2
(45) Date of Patent: Jun. 18, 2024

(54) DETECTION CIRCUIT AND ELECTRONIC DEVICE INCLUDING SAME

(71) Applicant: Samsung Electronics Co., Ltd., Suwon-si (KR)

(72) Inventors: Sanguk Kim, Suwon-si (KR); Taekho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 277 days.

(21) Appl. No.: 17/435,529

(22) PCT Filed: Aug. 24, 2021

(86) PCT No.: PCT/KR2021/011251
§ 371 (c)(1),
(2) Date: Sep. 1, 2021

(87) PCT Pub. No.: WO2022/050620
PCT Pub. Date: Mar. 10, 2022

(65) Prior Publication Data
US 2022/0326313 A1 Oct. 13, 2022

(30) Foreign Application Priority Data
Sep. 2, 2020 (KR) .......................... 10-2020-0111545

(51) Int. Cl.
*G01R 31/55* (2020.01)
*G01R 15/18* (2006.01)
(Continued)

(52) U.S. Cl.
CPC ............. *G01R 31/55* (2020.01); *G01R 15/18* (2013.01); *G01R 19/0084* (2013.01); *G01R 19/16566* (2013.01)

(58) Field of Classification Search
CPC .... G01R 31/55; G01R 15/18; G01R 19/0084; G01R 19/16566; G01R 31/70; G01R 31/2806; G01R 31/2879
See application file for complete search history.

(56) References Cited

U.S. PATENT DOCUMENTS 9,516,656 B2 12/2016 Lee et al.
10,067,178 B2 9/2018 Duke et al.
(Continued)

FOREIGN PATENT DOCUMENTS

JP 2011-064575 A 3/2011
JP 2014-219209 A 11/2014
(Continued)

OTHER PUBLICATIONS

International Search Report dated Dec. 21, 2021, issued in International Application No. PCT/KR2021/011251.
(Continued)

*Primary Examiner* — Feba Pothen
(74) *Attorney, Agent, or Firm* — Jefferson IP Law, LLP

(57) ABSTRACT

Disclosed is an electronic device is provided. The electronic device includes a first substrate, a second substrate arranged to be spaced apart from the first substrate, a first cable electrically connecting a first point on the first substrate and a second point on the second substrate, and a second cable electrically connecting a third point on the first substrate and a fourth point on the second substrate. The first substrate may include a first communication circuit, a second communication circuit, a detection circuit, a voltage application unit, and a ground unit, and a second substrate may include a first antenna, a first capacitive element, a second antenna, a second capacitive element, and an isolation circuit. The isolation circuit may isolate a radio frequency (RF) signal between the first path and the second path, and electrically (Continued)

connect the detection circuit to the ground unit through the first cable and the second cable.

15 Claims, 9 Drawing Sheets

(51) Int. Cl.
  *G01R 19/00* (2006.01)
  *G01R 19/165* (2006.01)

(56) References Cited

U.S. PATENT DOCUMENTS

| | | | |
|---|---|---|---|
| 10,283,846 B2 | 5/2019 | Choi et al. | |
| 10,317,458 B2 | 6/2019 | Duke et al. | |
| 10,476,213 B2 | 11/2019 | Kim | |
| 10,797,391 B2 | 10/2020 | Lee et al. | |
| 11,056,827 B2 | 7/2021 | Yeo et al. | |
| 11,183,753 B2 | 11/2021 | Hong | |
| 11,646,759 B2 | 5/2023 | Kim et al. | |
| 2019/0181590 A1* | 6/2019 | Bae | G01R 31/2813 |
| 2020/0103456 A1* | 4/2020 | Terayama | G01L 9/0016 |
| 2022/0052723 A1 | 2/2022 | Kim et al. | |
| 2022/0077576 A1 | 3/2022 | Hong | |

FOREIGN PATENT DOCUMENTS

| | | |
|---|---|---|
| KR | 10-2008-0039163 A | 5/2008 |
| KR | 10-2008-0043462 A | 5/2008 |
| KR | 10-2014-0031238 A | 3/2014 |
| KR | 10-2017-0083900 A | 7/2017 |
| KR | 10-2019-0032772 A | 3/2019 |
| KR | 10-2019-0039191 A | 4/2019 |
| KR | 10-2020-0058153 A | 5/2020 |
| KR | 10-2020-0073478 A | 6/2020 |
| KR | 10-2020-0092122 A | 8/2020 |
| WO | 2020-138998 A1 | 7/2020 |

OTHER PUBLICATIONS

Extended European Search Report dated Jan. 9, 2024, issued in European Patent Application No. 21864581.0.

\* cited by examiner

DETECTION CIRCUIT AND ELECTRONIC DEVICE INCLUDING SAME

TECHNICAL FIELD

The disclosure relates to a detection circuit and an electronic device including the same.

BACKGROUND ART

With the development of mobile communication technology, an electronic device having at least one antenna has been widely distributed. The electronic device may transmit and/or receive a radio frequency (RF) signal including a voice signal or data (e.g., a message, photo, video, music file, or game) by using an antenna.

An electronic device may include various components (e.g., a processor, an interface, and/or a circuit including a plurality of elements) on a plurality of printed circuit boards (PCBs). The electronic device may allow an RF signal to be transmitted and/or received between the printed circuit boards by using at least one cable (e.g., a coaxial cable or a flexible printed circuit board (FPCB)) connecting the printed circuit boards.

The above information is presented as background information only to assist with an understanding of the disclosure. No determination has been made, and no assertion is made, as to whether any of the above might be applicable as prior art with regard to the disclosure.

DISCLOSURE

Technical Problem

At least one detection circuit (e.g., a resistance, inductance, capacitance (RLC) circuit) may be arranged on the printed circuit boards to determine whether the cables electrically connecting the plurality of printed circuit boards are normally connected. The number of detection circuits for determining whether the cables are connected may be the same as the number of cables.

As the number of antennas increases due to the development of mobile communication technology, the number of cables for transmitting/receiving RF signals between antennas may also increase. Accordingly, due to the increase in the number of cables, the number of detection circuits to be included on a printed circuit board may also have to be increased. In this case, it may not be easy to mount the plurality of detection circuits on a printed circuit board having a limited space.

Aspects of the disclosure are to address at least the above-mentioned problems and/or disadvantages and to provide at least the advantages described below.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first substrate, a second substrate that is arranged to be spaced apart from the first substrate, a first cable electrically connecting a first point on the first substrate and a second point on the second substrate, and a second cable electrically connecting a third point on the first substrate and a fourth point on the second substrate. The first substrate includes a first communication circuit connected to the first point, a second communication circuit connected to the third point, a detection circuit, a voltage application unit connected to a path between the first point and the first communication circuit through the detection circuit, and a ground unit connected to a path between the third point and the second communication circuit. The second substrate includes a first antenna electrically connected to the second point through a first path, a first capacitive element arranged on the first path, a second antenna electrically connected to the fourth point through a second path, a second capacitive element arranged on the second path, and an isolation circuit arranged on a third path between the first path and the second path, and wherein the isolation circuit isolates an RF signal between the first path and the second path and electrically connects the detection circuit to the ground unit through the first cable and the second cable.

In accordance with another aspect of the disclosure, an electronic device is provided. The electronic device includes a first substrate, a second substrate that is arranged to be spaced apart from the first substrate, a first cable electrically connecting a first point on the first substrate and a second point on the second substrate, a second cable electrically connecting a third point on the first substrate and a fourth point on the second substrate, and a third cable electrically connecting a fifth point on the first substrate and a sixth point on the second substrate. The first substrate includes a first communication circuit connected to the first point, a second communication circuit connected to the third point, a third communication circuit connected to the fifth point, a detection circuit, a voltage application unit connected to a path between the first point and the first communication circuit through the detection circuit, a fourth capacitive element arranged on a fifth path between the third point and the second communication circuit, a fifth capacitive element arranged on a sixth path between the fifth point and the third communication circuit, and a second isolation circuit arranged on a seventh path between the fifth path and the sixth path. The second substrate includes a first antenna electrically connected to the second point through a first path, a first capacitive element arranged on the first path, a second antenna electrically connected to the fourth point through a second path, a second capacitive element arranged on the second path, a third antenna electrically connected to the sixth point through a third path, a third capacitive element arranged on the third path, a first isolation circuit arranged on a fourth path between the first path and the second path, and a ground unit connected to a path between the sixth point and the third capacitive element. The first isolation circuit is configured to isolate an RF signal between the first path and the second path, and the second isolation circuit electrically connects the detection circuit to the ground unit through the first cable, the second cable and the third cable and is configured to isolate an RF signal between the fifth path and the sixth path.

In accordance with another aspect of the disclosure, an electronic device is provided. The electronic device includes a first substrate, a second substrate arranged to be spaced apart from the first substrate, a first cable that electrically connects a first point on the first substrate and a second point on the second substrate, a second cable that electrically connects a third point on the first substrate and a fourth point on the second substrate, and a processor, wherein the first substrate includes a first communication circuit connected to the first point, a second communication circuit connected to the third point, a detection circuit connected to the processor, a voltage application unit connected to a path between the first point and the first communication circuit through the detection circuit, and a ground unit connected to a path between the third point and the second communication circuit, wherein the detection circuit includes a resistor connected in series with the voltage application unit, an inductor connected in series with the resistor, and a capacitor connected in parallel with the inductor and connected in series with the first communication circuit, wherein the second substrate includes a first antenna electrically connected to the second point through a first path, a first capacitor arranged on the first path, an second antenna electrically connected to the fourth point through a second path, a second capacitor arranged on the second path, and at least one of an inductor or a bead arranged on a third path that connects one point between the second point and the first capacitor to one point between the fourth point and the second capacitor, wherein the at least one of the inductor or the bead isolates an RF signal between the first path and the second path, and the detection circuit is electrically connected to the ground unit through the first cable and the second cable, wherein the processor detects a voltage at one point between the resistor and the inductor, and determines that at least one of the first cable or the second cable is not normally coupled when the detection result exceeds a specified range.

Advantageous Effects

According to various embodiments of the disclosure, it is possible to detect whether a plurality of cables are normally connected by using only one detection circuit on the printed circuit board, thereby securing the mounting space for a printed circuit board.

It is possible to minimize signal interference between antennas due to at least one inductive element (e.g., an inductor or a bead) arranged on a path electrically connecting the plurality of antennas.

Besides, various effects may be provided that are directly or indirectly identified through the disclosure.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
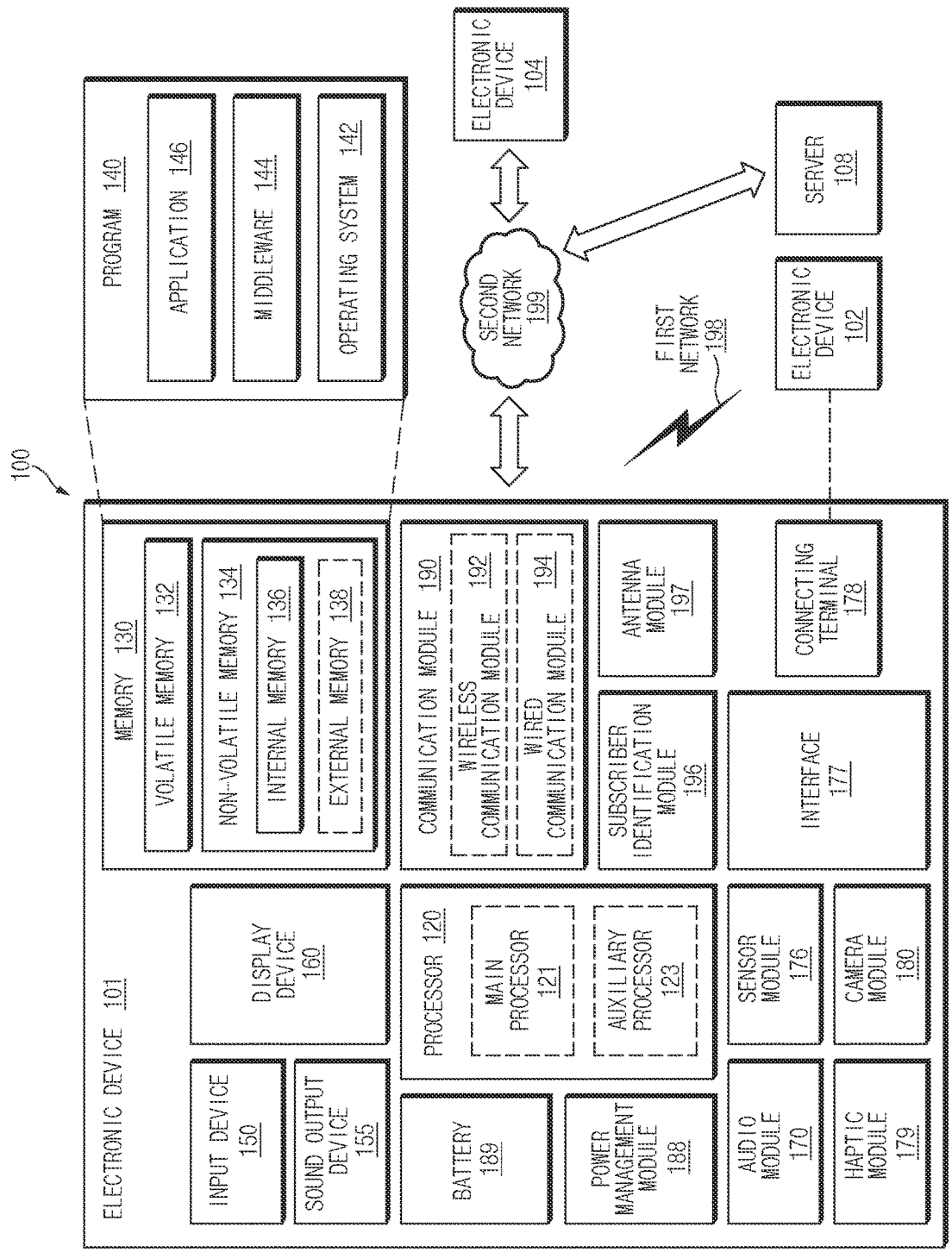
FIG. 1 is a block diagram illustrating an electronic device in a network environment according to an embodiment of the disclosure.

FIG. 1 is a block diagram illustrating an electronic device 101 in a network environment 100 according to an embodiment of the disclosure. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
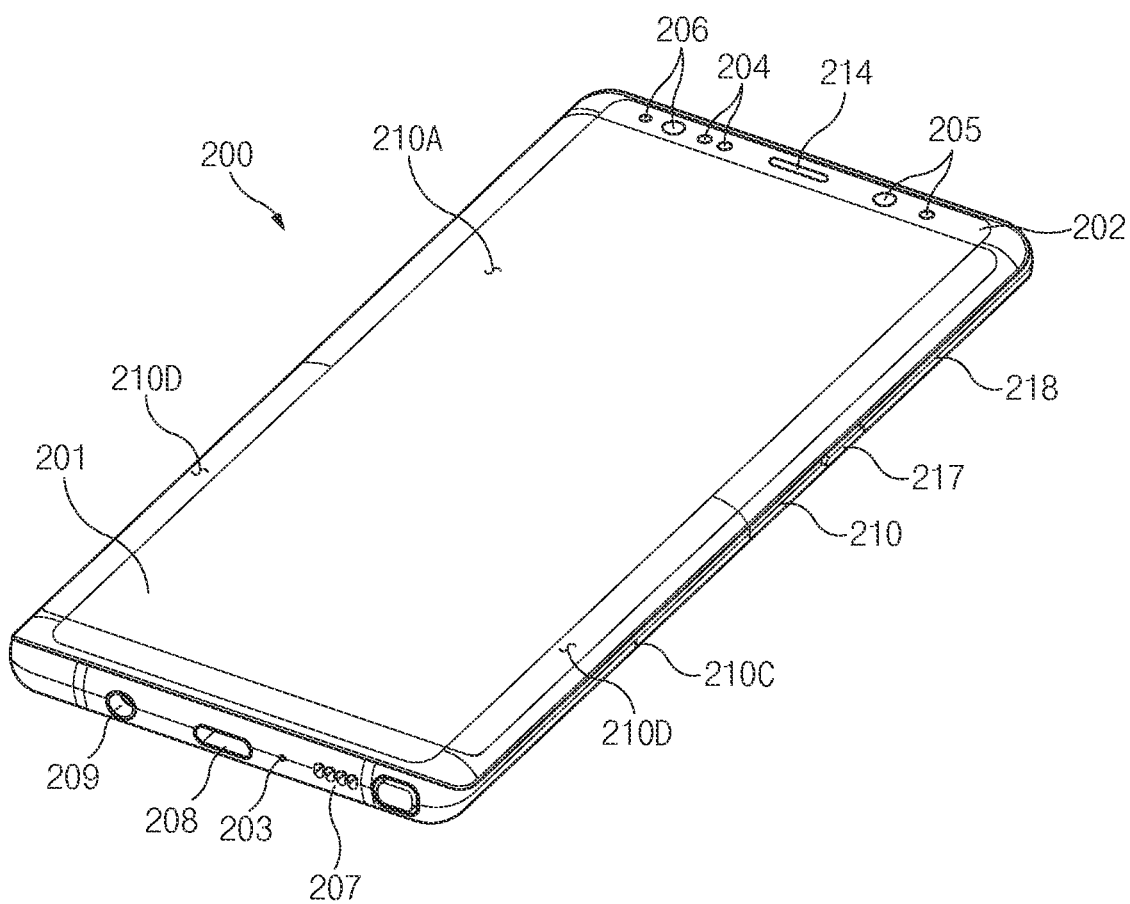
FIG. 2 is a perspective view of the front of an electronic device according to an embodiment of the disclosure.
Figure 3:
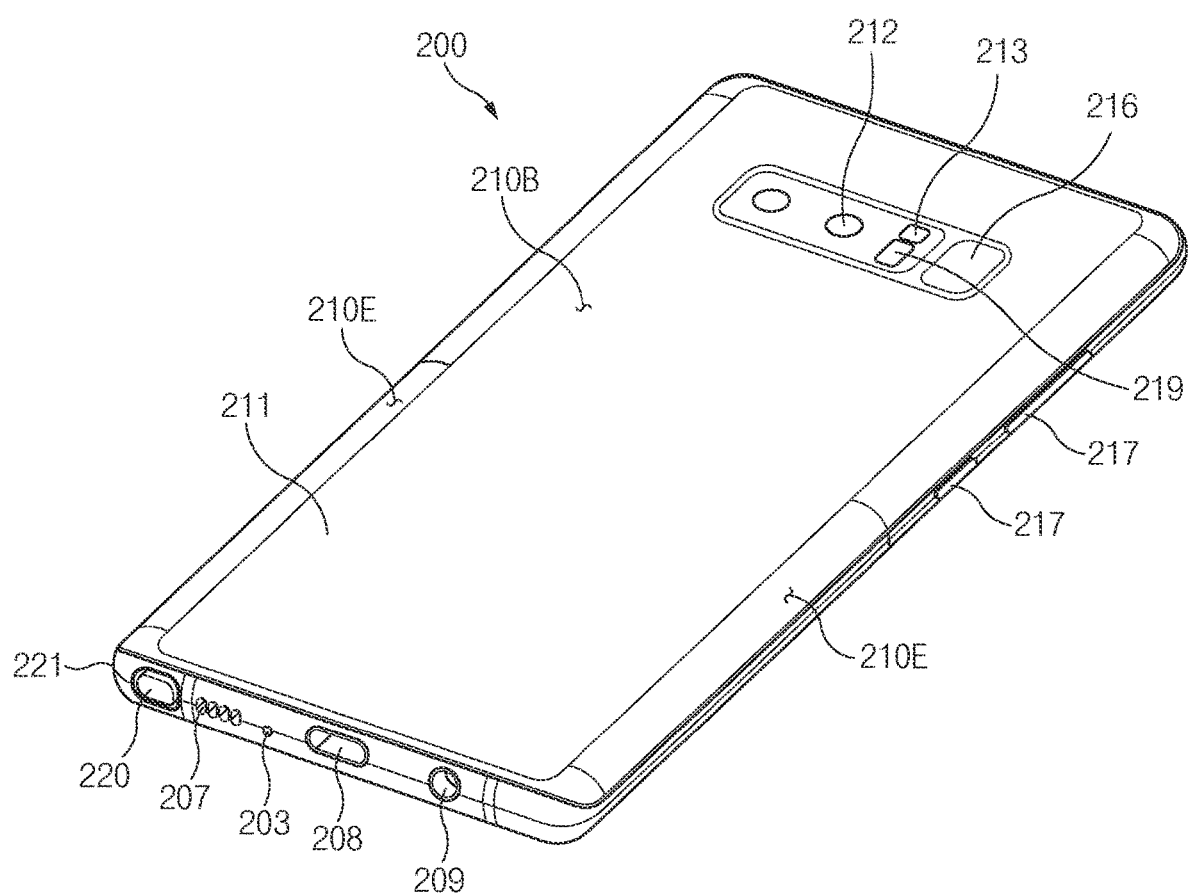
FIG. 3 is a perspective view illustrating the rear of an electronic device 200 according to an embodiment of the disclosure.

Hereinafter, front and rear perspective views of the electronic device 200 (e.g., the electronic device 101 of FIG. 1) are illustrated in FIGS. 2 and 3. Unless otherwise described, descriptions of components having the same reference numerals in FIGS. 3 and 4 may be referred to by the description of FIG. 3.

FIG. 2 is a perspective view of the front of an electronic device 200 (e.g., the electronic device of FIG. 1) according to an embodiment of the disclosure. FIG. 3 is a perspective view illustrating the rear of the electronic device (e.g., the electronic device of FIG. 1) according to an embodiment of the disclosure.

Referring to FIGS. 2 and 3, the electronic device 200 may include a housing 210 including a first surface (or front) 210A, a second surface (or rear) 210B, and a side surface 210C surrounding the space between the first and second surfaces 210A and 210B. According to another embodiment of the disclosure (not shown), the housing may refer to a structure that forms a part of the first surface 210A, the second surface 210B, and the side surface 210C of FIG. 1. According to an embodiment of the disclosure, the first surface 210A may be formed of a front plate 202 (e.g., a glass plate including various coating layers, or a polymer plate), at least a portion of which is substantially transparent. The second surface 210B may be formed of a substantially opaque rear plate 211. For example, the rear plate 211 may be formed of coated or colored glass, ceramic, polymer, metal (e.g., aluminum, stainless steel (STS), or magnesium), or a combination of at least two of the above materials. The side surface 210C may be coupled to the front plate 202 and the rear plate 211 and may be formed by a side bezel structure (or "side member") 218 including metal and/or polymer. In some embodiments, the rear plate 211 and the side bezel structure 218 may be integrally formed and may include the same material (e.g., a metal material such as aluminum).

In the embodiment shown in FIGS. 2 and 3, the front plate 202 may include two first areas 210D that extend seamlessly from the first surface 210A while being bent toward the rear plate 211, which are included in both long edges of the front plate 202. In the embodiment shown in FIG. 3, the rear plate 211 has two second regions 210E that extend seamlessly by bending from the second surface 210B toward the front plate 202 with long edges. The second regions 210E can be included at both ends. The front plate 202 (or the rear plate 211) may include only one of the first areas 210D (or the second areas 210E). One or both of the first areas 210D or the second areas 210E may not be included. In the above embodiments, when viewed from the side of the electronic device 200, as described above, the side bezel structure 218 may have a first thickness (or width) at a side that does not include the first areas 210D or the second areas 210E, and a second thickness thinner than the first thickness at a side that includes the first areas 210D or the second areas 210E.

At least one antenna radiator (e.g., a conductive pattern) may be arranged in a side member (e.g., the side bezel structure 218 of FIG. 3) of the housing 210 of the electronic device 200, two first areas 210D that extend seamlessly from the first surface 210A of the front plate 202 while being bent toward the rear plate 211, or two second areas 210E that extend seamlessly from the second surface 210B of the rear plate 211 while being bent toward the front plate 202.

The at least one antenna radiator may radiate a signal of a specified frequency band. The at least one antenna radiator may be an auxiliary radiator. For example, the at least one antenna radiator may radiate a signal in a 5G Sub-6 frequency band of 3.5 GHz to about 6 GHz, such as n41, n78, and/or n79. As another example, the at least one antenna radiator may radiate a signal in a Wi-Fi frequency band. The Wi-Fi frequency band may include frequency bands such as 802.11a and/or 802.11b.

The at least one antenna radiator may be a main radiator. Parts of the frequency band radiated by the main radiator and the frequency band radiated by the auxiliary radiator may be the same and remaining parts may be different.

As another example, at least one antenna radiator may radiate a frequency in a millimeter wave (mmWave) frequency band. For example, the mmWave frequency band may include a frequency band such as about 24-34 GHz and/or about 37-44 GHz. As still another example, the at least one antenna radiator may radiate a frequency in 11ay frequency band.

According to an embodiment of the disclosure, the electronic device 200 may include at least one of a display 201 (e.g., the display module 160 of FIG. 1), audio modules 203, 207 and 214 (e.g., the audio module 170 of FIG. 1), sensor modules 204, 216 and 219 (e.g., the sensor module 176 of FIG. 1), camera modules 205, 212 and 213 (e.g., the camera module 180 of FIG. 1), a key input device 217, a light emitting element 206, and connector holes 208 and 209. The electronic device 200 may omit at least one (e.g., the key input device 217 or the light emitting element 206) of the components or additionally include other components.

For example, the display 201 may be exposed through a substantial portion of the front plate 202. At least a portion of the display 201 may be exposed through the first surface 210A and the front plate 202 forming the first areas 210D of the side surface 210C. An edge of the display 201 may be formed to be substantially the same as an adjacent outer shape of the front plate 202. In another embodiment of the disclosure (not shown), in order to expand an exposed area of the display 201, the interval between the outer periphery of the display 201 and the outer periphery of the front plate 202 may be formed to be substantially the same.

In another embodiment of the disclosure (not shown), a recess or opening may be formed in a portion of the screen display area of the display 201, which may include at least one of the audio module 214, the sensor module 204, the camera module 205, and the light emitting element 206 which are is aligned with the recess or opening. In another embodiment (not shown), at least one of the audio module 214, the sensor module 204, the camera module 205, the fingerprint sensor 216, and the light emitting element 206 may be included in the rear surface of the screen display area of the display 201. In another embodiment of the disclosure (not shown), the display 201 may be coupled to or adjacent to a touch sensing circuit, a pressure sensor capable of measuring the intensity (pressure) of a touch, and/or a digitizer that detects a magnetic field type of a stylus pen. In an embodiment, at least a portion of the sensor modules 204 and 219, and/or at least a portion of the key input device 217 may be arranged in the first areas 210D and/or the second areas 210E.

The audio modules 203, 207 and 214 may include the microphone hole 203 and the speaker holes 207 and 214. A microphone for obtaining an external sound may be arranged in the microphone hole 203, and a plurality of microphones may be arranged to detect the direction of a sound. The speaker holes 207 and 214 may include the external speaker hole 207 and the receiver hole 214 for a call. The speaker holes 207 and 214 and the microphone hole 203 may be implemented as one hole, or a speaker (e.g., a piezo speaker) may be included without the speaker holes 207 and 214.

The sensor modules 204, 216 and 219 may generate an electrical signal or data value corresponding to an internal operating state of the electronic device 200 or an external environmental state. For example, the sensor modules 204, 216 and 219 may include, the first sensor module 204 (e.g., a proximity sensor) and/or a second sensor module (not shown) (e.g., a fingerprint sensor) arranged on the first surface 210A of the housing 210, and/or the third sensor module 219 (e.g., an HRM sensor) and/or the fourth sensor module 216 (e.g., a fingerprint sensor) arranged on the second surface 210B of the housing 210. The fingerprint sensor may be arranged on the second surface 210B as well as the first surface 210A (e.g., the display 201) of the housing 210. The electronic device 200 may further include at least one of sensor modules not shown, such as a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or the illuminance sensor 204.

The camera modules 205, 212 and 213 are the first camera device 205 arranged on the first surface 210A of the electronic device 200, and the second camera device 212 and/or the flash 213 arranged on the second surface 210B. The camera devices 205 and 212 may include one or more lenses, an image sensor, and/or an image signal processor. For example, the flash 213 may include a light emitting diode or a xenon lamp. In an embodiment, two or more lenses (infrared cameras, wide angle and telephoto lenses) and image sensors may be arranged on one surface of the electronic device 200.

The key input device 217 may be arranged on the side surface 210C of the housing 210. In another embodiment of the disclosure, the electronic device 200 may not include a portion or all of the above-mentioned key input device 217 and the remaining parts of key input devices 217 may be implemented in a form of a soft key displayed on the display 201. The key input device may include the sensor module 216 arranged on the second surface 210B of the housing 210.

For example, the light emitting element 206 may be arranged on the first surface 210A of the housing 210. The light emitting element 206 may provide state information of the electronic device 200 in the form of light. In another embodiment of the disclosure, the light emitting element 206 may provide a light source that is interlocked with the operation of the camera module 205. For example, the light emitting element 206 may include a light emitting diode (LED), an IR LED and a xenon lamp.

The connector holes 208 and 209 may include the first connector hole 208 that can receive a connector (e.g., a USB connector) for transmitting and receiving power and/or data to and from an external electronic device, and/or the second connector hole (e.g., an earphone jack) 209 that can accommodate a connector for transmitting and receiving an audio signal to and from an external electronic device. The electronic device 200 may also include a stylus hole 221 to receive a stylus 220 therein.

Figure 4:
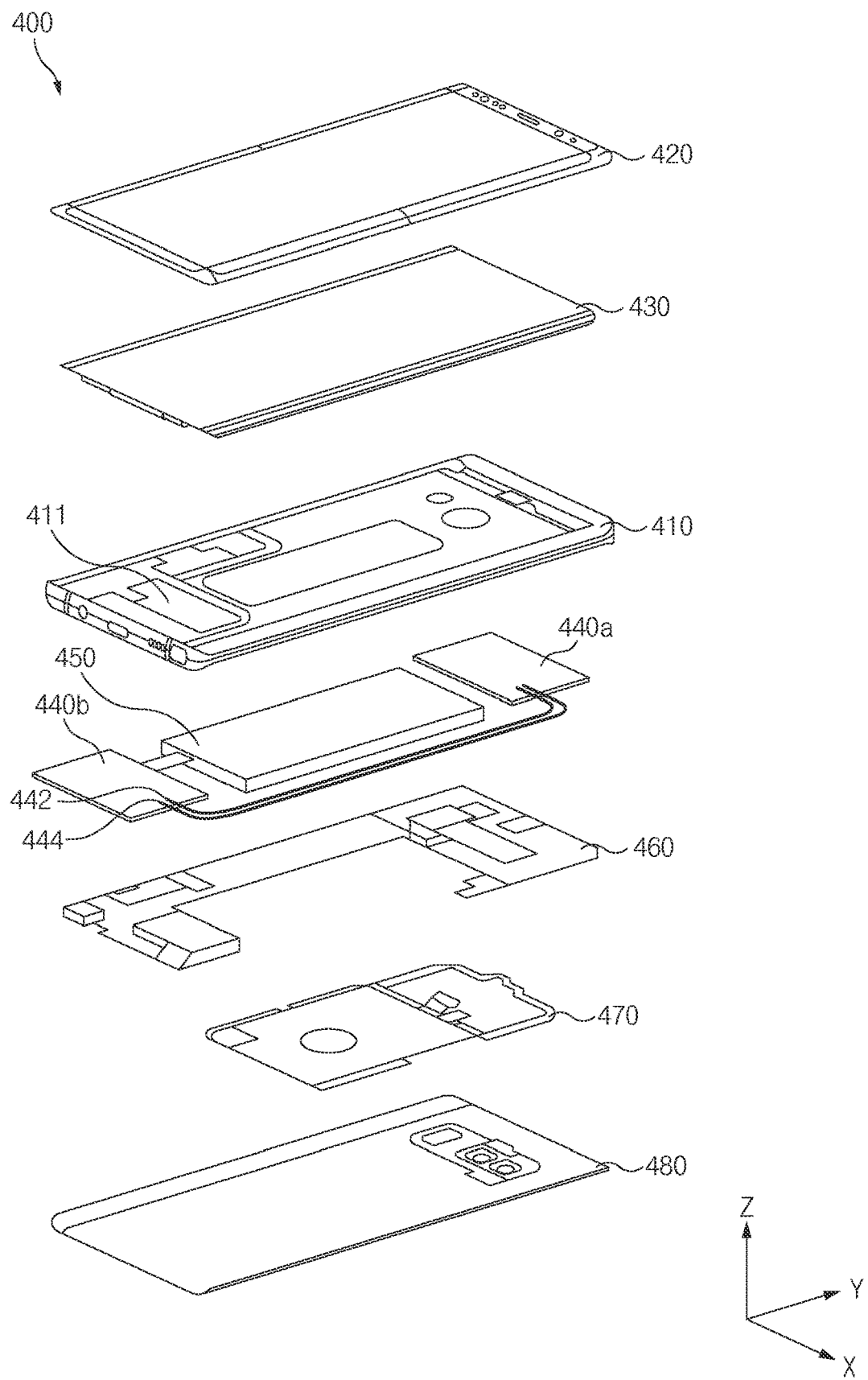
FIG. 4 is an exploded perspective view of an electronic device according to an embodiment of the disclosure.

FIG. 4 is an exploded perspective view 400 of an electronic device (e.g., the electronic device of FIG. 2 and/or FIG. 3) according to an embodiment of the disclosure. Referring to FIG. 4, the electronic device 200 may include a side bezel structure 410 (e.g., the side bezel structure 218 of FIG. 2), a first support member 411 (e.g., a bracket), a front plate 420, a display 430 (e.g., the display 201 of FIG. 2), a first substrate 440a, a second substrate 440b, a first cable 442, a second cable 444, a battery 450, a second support member 460 (e.g., a rear case), an antenna 470, and a rear plate 480 (e.g., the rear plate 211 of FIG. 3). The electronic device 200 may omit at least one (e.g., the first support member 411 or the second support member 460) of the components or additionally include other components. At least one of the components of the electronic device 200 may be the same as or similar to at least one of the components of the electronic device 200 of FIG. 1, FIG. 2 and/or FIG. 3, and overlapped descriptions will be omitted.

The first support member 411 may be arranged in the electronic device 200 and connected to the side bezel structure 410 or may be integrally formed with the side bezel structure 410. For example, the first support member 411 may be formed of a metal material and/or a non-metal material (e.g., polymer). The first support member 411 may have one surface coupled to the display 430 and an opposite surface coupled to a PCB 440.

The first substrate 440a may include a processor (e.g., the processor 120 of FIG. 1), a memory (e.g., the memory 130 of FIG. 1), an interface (e.g., the interface 177 of FIG. 1), a voltage application unit, at least one communication circuit, a detection circuit, and a plurality of passive elements arranged in one area. For example, the processor 120 may include one or more of a central processing unit (CPU), an application processor (AP), a graphic processing unit (GPU), an image signal processor (ISP), a sensor hub processor (SHP), or a communication processor (CP). For example, the memory may include a volatile memory or a non-volatile memory. The interface may include a high definition multimedia interface (HDMI), a universal serial bus (USB) interface, an SD card interface, and/or an audio interface. For example, the interface may allow the electronic device 200 to be electrically or physically connected to an external electronic device (e.g., the electronic devices 102 and 104 of FIG. 1), and may include a USB connector, an SD card/multi media card (MMC) connector, or an audio connector. The voltage application unit may generate a direct current (DC) voltage and transmit it to an outside (e.g., the second substrate 440b). At least one communication circuit may generate an RF signal and transmit the RF signal to the outside. The detection circuit may have a structure including a resistor, an inductor and a capacitor. A plurality of passive elements may include at least one capacitive element (e.g., a capacitor) or at least one inductive element (e.g., an inductor or a bead).

The second substrate 440b may include a plurality of antennas and an isolation circuit arranged in at least one area. The plurality of antennas may correspond to a radiator (e.g., a conductive pattern) formed on one area of the second substrate 440b. The isolation circuit may include at least one inductive element (e.g., an inductor or a bead).

The first cable 442 and the second cable 444 may electrically connect a point on the first substrate 440a and a point on the second substrate 440b. The first cable 442 may correspond to a path through which signals and data transmitted and/or received between the first and second substrates 440a and 440b move. The first and second cables 442 and 444 may be coaxial cables or flexible printed circuit boards (FPCB s).

The battery 450, which is a device for supplying power to at least one component of the electronic device 200, may include, a non-rechargeable primary battery, a rechargeable secondary battery or a fuel cell. At least a portion of the battery 450 may be arranged on substantially the same plane as the PCB 440. The battery 450 may be integrally arranged in the electronic device 200, or may be arranged detachably from the electronic device 200.

The short-range antenna 470 may be arranged between the rear plate 480 and the battery 450. For example, the antenna 470 may include a near field communication (NFC) antenna, a wireless charging antenna and/or a magnetic secure transmission (MST) antenna. The antenna 470 may perform short-range communication with an external device or wirelessly transmit/receive power required for charging. In another embodiment of the disclosure, an antenna structure may be formed by a portion the side bezel structure 410 and/or the first support member 411, or a combination thereof.

In FIG. 4, the electronic device 200 is illustrated as including two substrates 440a and 440b and two cables 442 and 444, but this is exemplary and various embodiments of the disclosure are not limited thereto. For example, the electronic device 200 may include three or more substrates and cables.

Figure 5:
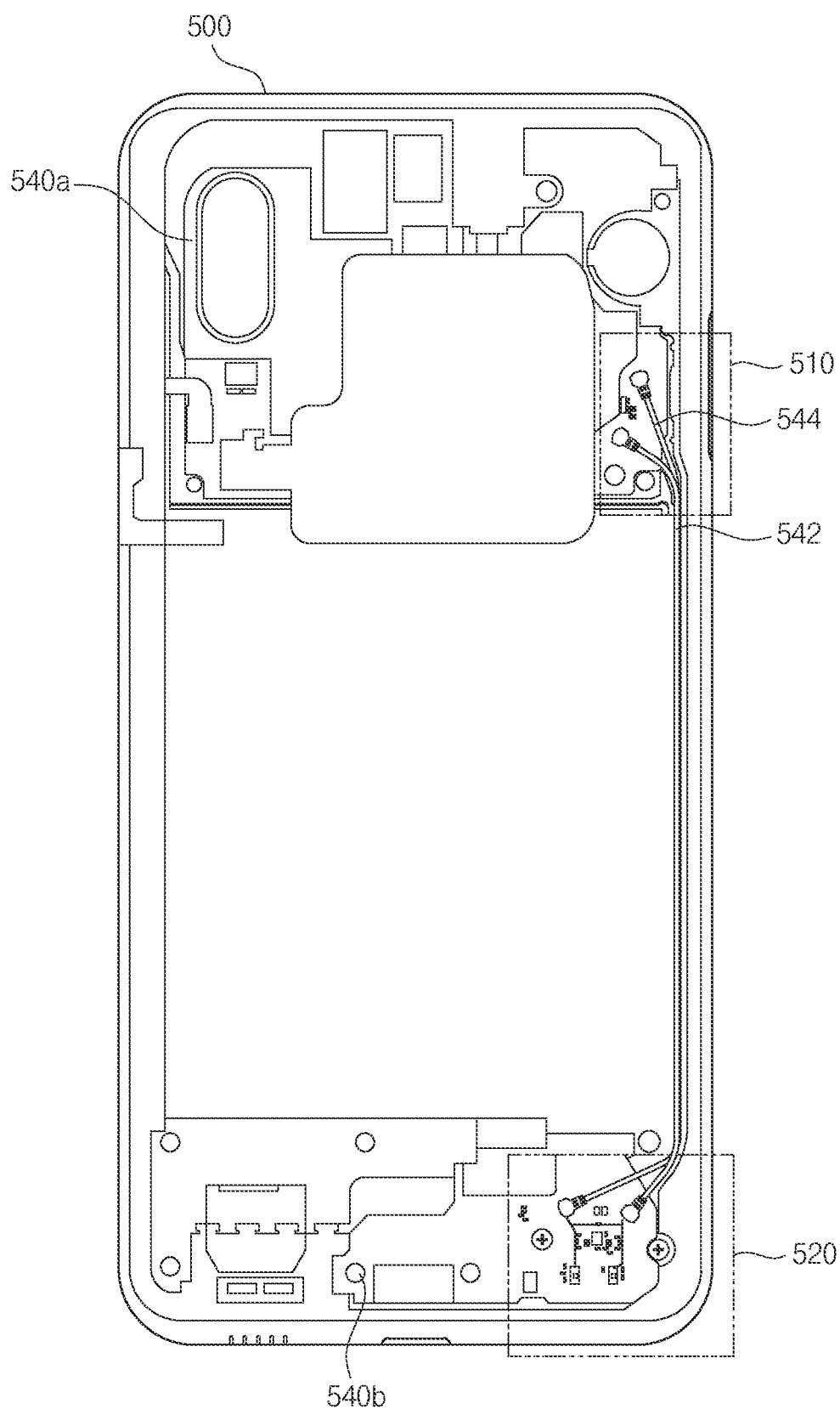
FIG. 5 is an internal perspective view of an electronic device including a plurality of printed circuit boards according to an embodiment of the disclosure.

FIG. 5 is an internal perspective view of an electronic device including a plurality of printed circuit boards according to an embodiment of the disclosure.

Referring to FIG. 5, The electronic device 500 (e.g., the electronic device 101 of FIG. 1) may include the first substrate 540a and the second substrate 540b arranged inside a housing. For example, the first substrate 540a may be arranged while being physically spaced apart from the second substrate 540b.

Referring to reference numerals 510 and 520, the first substrate 540a and the second substrate 540b may be electrically connected through a cable. For example, a first cable 542 may electrically connect the first point of the first substrate 540a and the second point of the second substrate, and a second cable 544 may electrically connect the third point of the first substrate 540a and the fourth point of the second substrate 540b.

According to an embodiment of the disclosure, the electronic device 501 may determine whether the first cable 542 and the second cable 544 are normally coupled by using a detection circuit included in the first substrate 540a. For example, the electronic device 501 may transmit the DC voltage applied using the voltage application unit included in the first substrate 540a to the ground unit arranged on the first substrate 540a through the first cable 542 and the second cable 544. When the DC voltage is transmitted to the ground unit, the electronic device 501 may detect a voltage at one point in the detection circuit, and when the detection result exceeds a specified range (e.g., the voltage at one point in the detection circuit exceeds 0 V), the electronic device 501 may determine that at least one of the first cable 542 and the second cable 544 is not normally coupled. When the detection result does not exceed the specified range (e.g., when the voltage at one point of the detection circuit is 0 V), the electronic device 501 may determine that both the first and second cables 542 and 544 are normally coupled.

Figure 6:
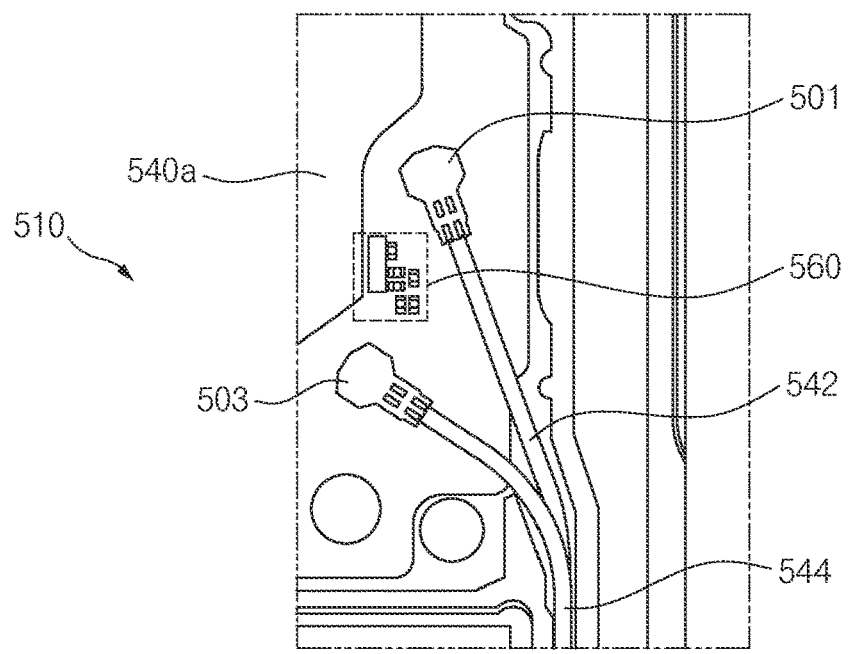
FIG. 6 is an internal perspective view of an electronic device including a plurality of printed circuit boards according to an embodiment of the disclosure.
Figure 6:
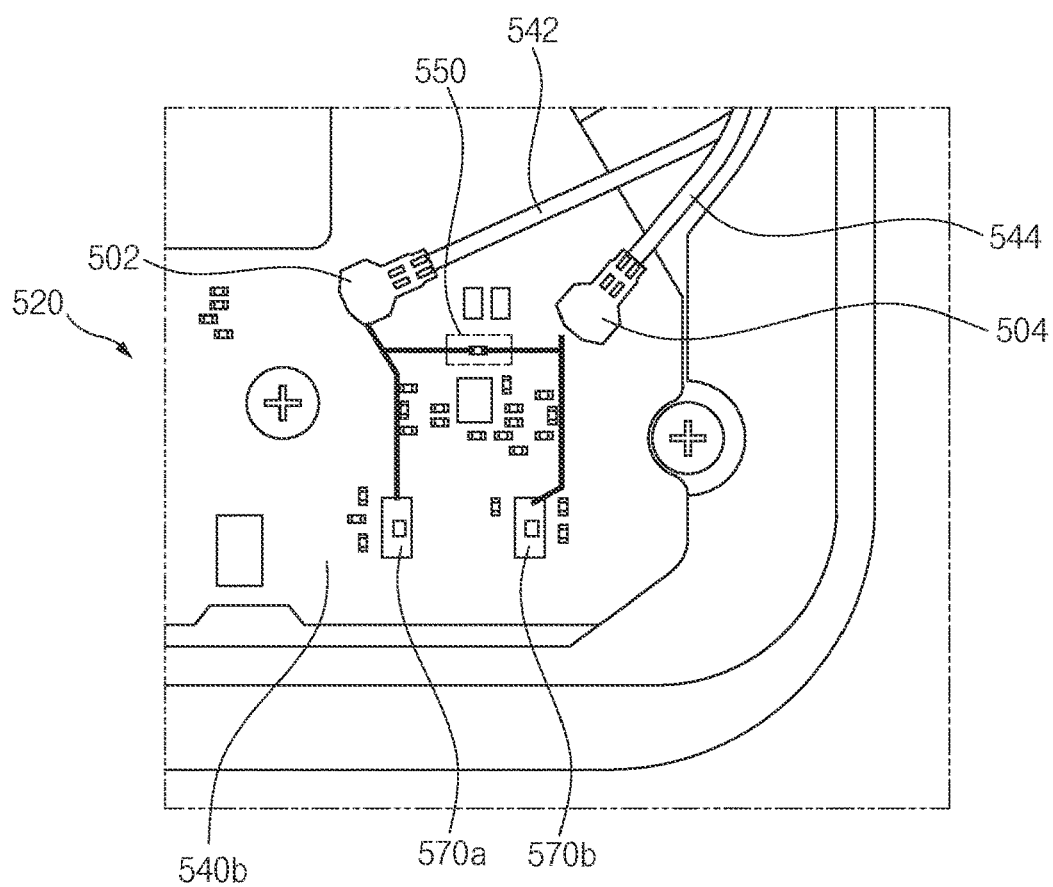

FIG. 6 is an internal perspective view of the electronic device 501 including the plurality of printed circuit boards 540a and 540b according to an embodiment of the disclosure.

Referring to FIG. 6, the first substrate 540a of reference numeral 510 may include a first communication circuit connected to a first point 501, a second communication circuit connected to a third point 503, a detection circuit 560, a voltage application unit connected to a path between the first point 501 and the first communication circuit through the detection circuit 560, and a ground unit connected to a path between the third point 503 and the second communication circuit. For example, the DC voltage applied by the voltage application unit included in the first substrate 540a may pass sequentially through the first point 501 and the first cable 542 to be transmitted to a second point 502 on the second substrate 540b.

Referring to reference numeral 520, the second substrate 540b may include a first antenna 570a electrically connected to the second point 502 through a first path, a first capacitive element arranged on the first path, a second antenna 570b electrically connected to a fourth point 504 through a second path, a second capacitive element arranged on the second path, and an isolation circuit 550 arranged in a third path between the first path and the second path. For example, the DC voltage transmitted from the voltage application unit included in the first substrate 540a to the second point 502 through the first cable 542 may pass sequentially through the fourth point 504 and the second cable 544 to be transmitted to the third point 503 on the first substrate 540a.

The content of various components (e.g., the detection circuit 560, the voltage application unit, a plurality of passive elements, and/or a plurality of antennas) arranged on the first substrate 540a and the second substrate 540b may be referred to in more detail in the description of FIGS. 7 to 8 to be described later.

Figure 7:
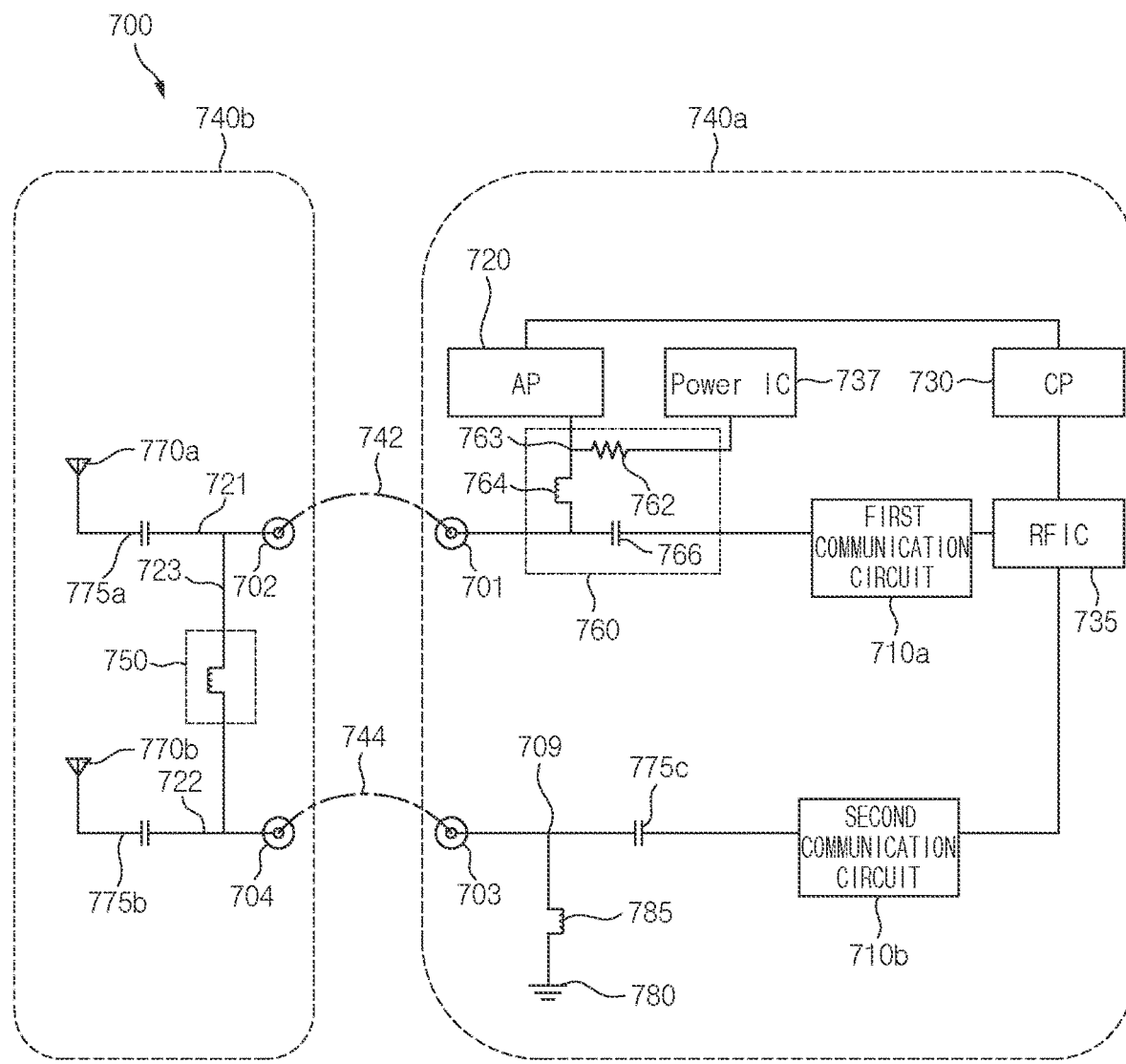
FIG. 7 is a circuit diagram including a detection circuit according to an embodiment of the disclosure.

FIG. 7 is a circuit diagram 700 including a detection circuit according to an embodiment of the disclosure.

Referring to FIG. 7, according to an embodiment of the disclosure, an electronic device (e.g., the electronic device 101 of FIG. 1) may include a first substrate 740a and a second substrate 740b arranged in a housing. For example, the first substrate 740a and the second substrate 740b may be arranged while being physically spaced apart from each other in the housing.

The first substrate 740a and the second substrate 740b may be electrically connected to each other through at least one cable 742 and 744. The first cable 742 may connect a first point 701 on the first substrate 740a and a second point 702 on the second substrate 740b, thereby electrically connecting the first substrate 740a and the second substrate 740b. The second cable 744 may connect a third point 703 on the first substrate 740a and a fourth point 704 on the second substrate 740b, thereby electrically connecting the first substrate 740a and the second substrate 740b.

The first substrate 740a may include a first communication circuit 710a connected to the first point 701, a second communication circuit 710b connected to the third point 703, an application processor 720, a communication processor 730, a radio frequency integrated circuit (RFIC) 735, the detection circuit 760, a voltage application unit 737 connected to a path between the first point 701 and the first communication circuit 710a through the detection circuit, and a ground unit 780 connected to a path between the third point 703 and the second communication circuit 710b. In addition, the first substrate 740a may further include a third capacitive element 775c arranged on a path between the third point 703 and the second communication circuit 710b, and an inductive element 785 arranged on a path between the ground unit 780 and a point between the third capacitive element 776 and the ground unit 780.

The first communication circuit 710a and the second communication circuit 710b may be configured to process signals in various frequency bands. For example, the first communication circuit 710a and the second communication circuit 710b may include at least one of a duplexer, an amplifier, a low noise amplifier (LNA), and a switch. The first communication circuit 710a and the second communication circuit 710b may be implemented as a single chip or at least a part of a single package.

The application processor 720 (e.g., the main processor 120 of FIG. 1) may execute software (e.g., the program 140 of FIG. 1) to control at least one other component (e.g., a hardware or software component) of the electronic device connected to a processor (e.g., the processor 120 of FIG. 1), or perform various data processing or calculation functions. The application processor 720 may include an analog-digital converter (ADC). For example, the application processor 720 may receive a code value corresponding to a DC voltage applied from the voltage application unit 737 through an analog-digital converter (ADC) electrically connected to a point 763 of the detection circuit 760, and measure the DC voltage by using the received code value.

The communication processor 730 (e.g., the auxiliary processor 123 of FIG. 1) may replace the application processor 720 while the application processor 720 is in an inactive (e.g., sleep) state. Alternatively, the communication processor 730 may perform wireless communication with the application processor 720 that is in an active state (e.g., application execution). According to various embodiments, the communication processor 730 may be implemented as a part of another component. For example, the communication processor 730 may be implemented as a part of the application processor 720 or a wireless communication circuit (not shown).

The RFIC 735 may be electrically connected to various components (e.g., a first antenna 770a and a second antenna 770b). The RFIC 735 may transmit and receive RF signals. For example, when transmitting an RF signal, the RFIC 735 may perform an operation of converting (e.g., up-converting) a signal to be transmitted into a signal of a specified frequency. As another example, when receiving an RF signal, the RFIC 735 may convert (e.g., down-convert) the received signal of a frequency into a signal of a frequency that can be processed by the communication processor 730.

The first antenna 770a and the second antenna 770b may transmit or receive a signal or power to the outside (e.g., an external electronic device). For example, the first antenna 770a may receive an RF signal transmitted from the first communication circuit 710a, and the second antenna 770b may receive an RF signal transmitted from the second communication circuit 710b. Although the first antenna 770a and the second antenna 770b are illustrated as being arranged on the second substrate 740b, the embodiment is not limited thereto and refers to a radiator structure corresponding to at least one area of a side member of the electronic device.

The detection circuit 760 may be electrically connected to the ground unit 780 through the first cable 742 and the second cable 744. The detection circuit 760 may include a resistor 762 connected in series to the voltage application unit 737, an inductor 764 connected in series to the resistor 762 via point 763, and a capacitor 766 connected in parallel to the inductor 764 and connected in series to the first communication circuit 710a.

The second substrate 740b may include the first antenna 770a electrically connected to the second point 702 through a first path 721, a first capacitive element 775a arranged on the first path 721, the second antenna 770b electrically connected to the fourth point 704 through a second path 722, a second capacitive element 775b arranged on the second path 722, and an isolation circuit 750 arranged on a third path 723 between the first and second paths 721 and 722. The third path 723 may be referred as a path that connects one point between the second point 702 and the first capacitive element 775a to one point between the fourth point 704 and the second capacitive element 775b. Although the first and second antennas 770a and 770b are illustrated as being arranged on the second substrate 740b, they may refer to radiators formed in at least one area of a side member of the electronic device. For example, the isolation circuit 750 may include at least one inductive element (e.g., an inductor or a bead).

According to an embodiment of the disclosure, a plurality of passive elements and/or an isolation circuit provided on a substrate may pass or block at least a portion of a signal transmitted from an outside. For example, the first capacitive element 775a may be connected in series with the first antenna 770a to pass or block a specified signal. For example, the first capacitive element 775a may pass the RF signal transmitted from the first communication circuit 710a through the first cable 742 in the direction of the first antenna 770a, and may block the DC voltage transmitted from the voltage application unit 737 through the first cable 742 from the first antenna 770a. The second capacitive element 775b may be connected in series with the second antenna 770b to pass or block a specified signal. For example, the second capacitive element 775b may pass the RF signal transmitted from the second communication circuit 710b through the second cable 744 in the direction of the second antenna 770b, and may block the DC voltage transmitted from the voltage application unit 737 sequentially through the first cable 742 and the isolation circuit 750 from the second antenna 770b. The third capacitive element 775c may be connected in series with the second communication circuit 710b to pass or block a specified signal. The third capacitive element 775c passes the RF signal transmitted from the second communication circuit 710b in the direction of the third point 703, and may block the DC voltage transmitted from the voltage application unit 737 sequentially through the first cable 742, the isolation circuit 750 and the second cable 744 from the second communication circuit 710b.

The inductive element 785 may be arranged on a path between a point 709 between the third point 703 and the third capacitive element 775c and the ground unit 780. The inductive element 785 may be connected in parallel with the third capacitive element 775c and may be connected in series with the ground unit 780 to pass or block a specified signal. The inductive element 785 may pass the DC voltage transmitted from the voltage application unit 737 through the first cable 742, the isolation circuit 750 and the second cable 744 sequentially in the direction of the ground unit 780, and may isolate the RF signal between the point 709 between the third point 703 and the third capacitive element 775c and the ground unit 780.

The isolation circuit 750 may be connected in parallel to the first and second capacitive elements 775a and 775b to pass or block a specified signal. For example, the isolation circuit 750 may pass the DC voltage transmitted from the voltage application unit 737 through the first cable 742 in the direction of the second cable 744 and may isolate the RF signal on the third path 723.

According to an embodiment of the disclosure, the application processor 720 included in the first substrate 740a may detect a voltage at one point 763 of the detection circuit 760, and may determine whether a cable is normally coupled based on the detection result. The one point 763 of the detection circuit 760 may be referred to as a point between the resistor 762 and the inductor 764 included in the detection circuit 760. For example, when the detection result exceeds a specified range, the application processor 720 may determine that at least one of the first cable 742 and the second cable 744 is not normally coupled. As another example, when the detection result does not exceed the specified range, the application processor 720 may determine that both the first cable 742 and the second cable 744 are normally coupled.

FIG. 7 illustrates two cables are for electrically connecting a plurality of substrates, but the embodiment is not limited thereto. For example, the electronic device may further include a third cable (not shown) electrically connecting the first substrate 740a and the second substrate 740b. Hereinafter, the electronic device further including the third cable will be described in detail with reference to FIG. 8.

Figure 8:
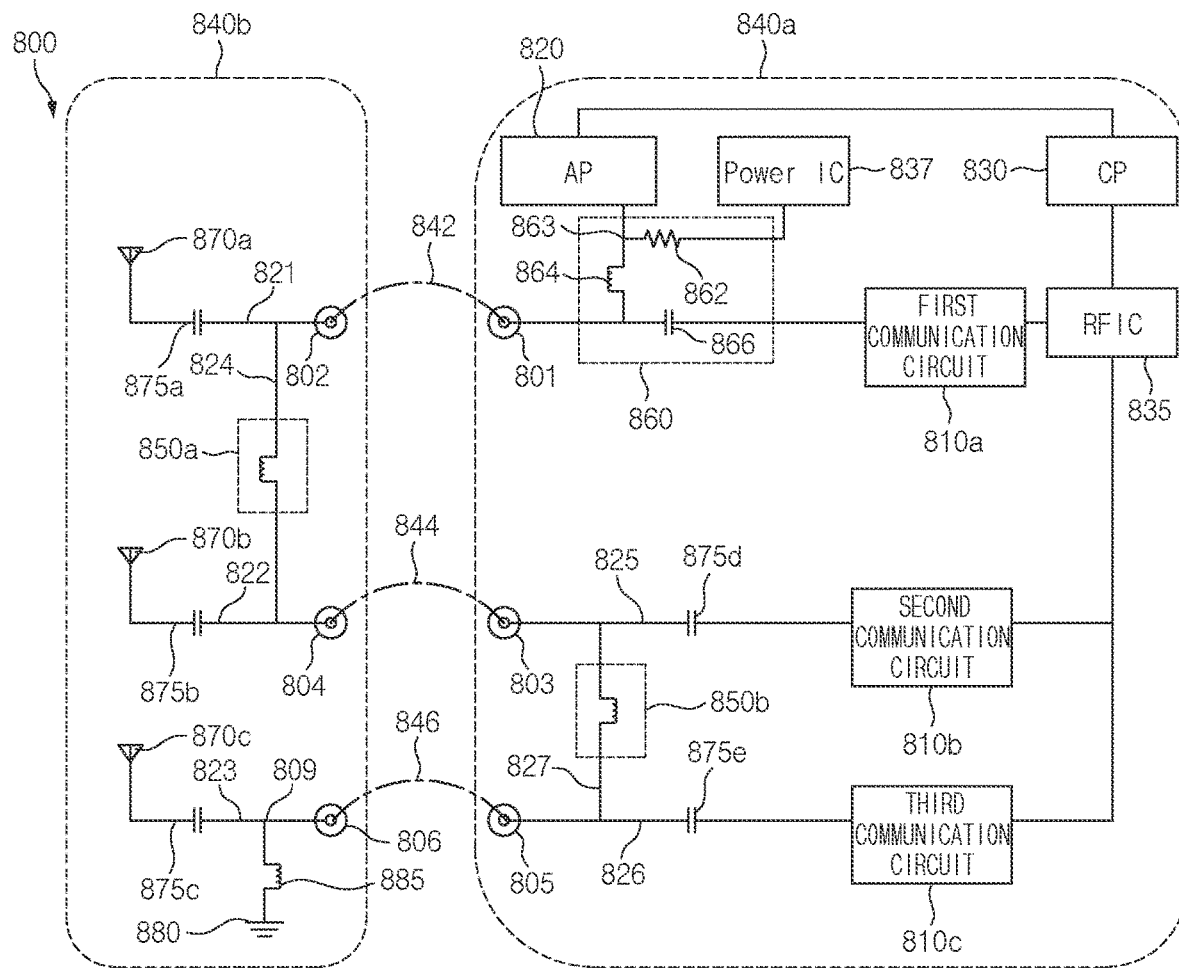
FIG. 8 is a circuit diagram including a detection circuit according to an embodiment of the disclosure.

FIG. 8 is a circuit diagram 800 including a detection circuit according to an embodiment of the disclosure.

Referring to FIG. 8, according to an embodiment of the disclosure, an electronic device (e.g., the electronic device 101 of FIG. 1) may include three cables 842, 844 and 846 for electrically connecting a plurality of substrates. Among the components of FIG. 8, descriptions of the same or similar components as those of FIG. 7 may refer to the description of FIG. 7.

According to an embodiment of the disclosure, an electronic device (e.g., the electronic device 101 of FIG. 1) may include a first substrate 840a and a second substrate 840b arranged in a housing. The first and second substrates 840a and 840b may be electrically connected to each other through at least one cable 842, 844 and 846. For example, the third cable 846 may connect a fifth point 805 on the first substrate 840a and a sixth point 806 on the second substrate 840b to electrically connect the first substrate 840a and the second substrate 840b.

The first substrate 840a may include a first communication circuit 810a connected to a first point 801, a second communication circuit 810b connected to a third point 803, a third communication circuit 810c connected to a fifth point 805, an application processor 820, a communication processor 830, an RFIC 835, the detection circuit 860, a voltage application unit 837 connected to a path between the first point 801 and the first communication circuit 810a through the detection circuit, and a ground unit 880 connected to a path between the third point 803 and the second communication circuit 810b. Additionally, the first substrate 840a may include a fourth capacitive element 875d arranged on a fifth path 825 between the third point 803 and the second communication circuit 810b, a fifth capacitive element 875e arranged on a sixth path 826 between the fifth point 805 and the third communication circuit 810c, and a second isolation circuit 850b arranged on a seventh path 827 between the fifth path 825 and the sixth path 826.

The first communication circuit 810a, the second communication circuit 810b, and the second communication circuit 810c may be configured to process signals in various frequency bands. For example, the first communication circuit 810a, the second communication circuit 810b and the second communication circuit 810c may include at least one of a duplexer, an amplifier, a low noise amplifier (LNA), or a switch. The first communication circuit 810a, the second communication circuit 810b, and the second communication circuit 810c may be implemented as a single chip or at least a part of a single package.

The RFIC 835 may be electrically connected to various components (e.g., a first antenna 870a, a second antenna 870b, and/or a third antenna 870c). The RFIC 835 may transmit and receive RF signals.

For example, the first antenna 770a, the second antenna 770b, and the third antenna 770c may transmit a signal or power to the outside (e.g., an external electronic device) or receive a signal from the outside. For example, the third antenna 870c may receive an RF signal transmitted from the third communication circuit 810c. The first antenna 770a, the second antenna 770b and the third antenna 770c are illustrated as being arranged on the second substrate 740b, but the embodiment is not limited thereto and they may also be referred to as a radiator structure corresponding to at least one area of a side member of the electronic device.

The detection circuit 860 may be electrically connected to the ground unit 880 through the first and second cables 842 and 844. The detection circuit 860 may include a resistor 862 connected in series to the voltage application unit 837, an inductor 864 connected in series to the resistor 862, and a capacitor 866 connected in parallel to the inductor 864 and connected in series to the first communication circuit 810a.

According to an embodiment of the disclosure, the second substrate 840b may include the first antenna 870a electrically connected to a second point 802 through a first path 821, a first capacitive element 875a arranged on the first path 821, the second antenna 870b electrically connected to a fourth point 804 through a second path 822, a second capacitive element 875b arranged on the second path 822, the third antenna 870c electrically connected to the sixth point 806 through a third path 823, a third capacitive element 875c arranged on the third path, a first isolation circuit 850a arranged on a fourth path 824 between the first and second paths, and the ground unit 880 connected to a path between the sixth point 806 and the third capacitive element 875c.

The first and second isolation circuits 850a and 850b may include at least one of an inductor or a bead. For example, the detection circuit 860 may be electrically connected to the ground unit 880 through the first, second and third cables 842, 844 and 846.

The fourth path 824 may be referred to as a path that connects one point between the second point 802 and the first capacitive element 875a to one point between the fourth point 804 and the second capacitive element 875b. The seventh path 827 may be referred to as a path that connects one point between the third point 803 and the fourth capacitive element 875d to one point between the fifth point 805 and the fifth capacitive element 875e.

According to an embodiment of the disclosure, a plurality of passive elements and/or a plurality of isolation circuits included on a substrate may pass or block at least a portion of a signal transmitted from an outside. For example, the third capacitive element 875c may be connected in series with the third antenna 870c to pass or block a specified signal. The third capacitive element 875c may pass the RF signal transmitted from the second communication circuit 710b in the direction of the third point 703, and may block the DC voltage transmitted from the voltage application unit 837 sequentially through the first cable 842, the first isolation circuit 850a, the second cable 844, the second isolation circuit 850b, and the third cable 846 from the third antenna 870c. The fourth capacitive element 875d may be connected in series with the second communication circuit 810b to pass or block a specified signal. The fourth capacitive element 875d may pass the RF signal transmitted from the second communication circuit 710b in the direction of the third point 803, and may block the DC voltage transmitted from the voltage application unit 837 sequentially through the first cable 842, the first isolation circuit 850a, and the second cable 844 from the second communication circuit 810b. The fifth capacitive element 875e may be connected in series with the third communication circuit 810c to pass or block a specified signal. The fifth capacitive element 875e may pass the RF signal transmitted from the third communication circuit 810c in the direction of the fifth point 805, and may block the DC voltage transmitted from the voltage application unit 837 sequentially through the first cable 842, the first isolation circuit 850a, the second cable 844, and the second isolation circuit 850b from the third communication circuit 810c.

An inductive element 885 may be arranged on a path between one point 809 between the sixth point 806 and the third capacitive element 875c and the ground unit 880. The inductive element 885 may be connected in parallel with the third capacitive element 875c and may be connected in series with the ground unit 880 to pass or block a specified signal. The inductive element 885 may pass the DC voltage transmitted from the voltage application unit 837 sequentially through the first cable 842, the first isolation circuit 850a, the second cable 844, the second isolation circuit 850b, and the third cable 846 in the direction of the ground unit 880, and may isolate the RF signal between one point 809 between the sixth point 806 and the third capacitive element 875c and the ground unit 880.

The first isolation circuit 850a may be connected in parallel to the first capacitive element 875a and the second capacitive element 875b to pass or block a specified signal. The first isolation circuit 850a may pass the DC voltage transmitted from the voltage application unit 837 through the first cable 842 in the direction of the second cable 844, and may isolate the RF on the fourth path 824.

The second isolation circuit 850b may be connected in parallel to the fourth capacitive element 875d and the fifth capacitive element 875e to pass or block a specified signal. As an example, the second isolation circuit 850b may pass the DC voltage transmitted from the voltage application unit 837 through the first cable 842, the first isolation circuit 850a, and the second cable 844 sequentially in the direction of the third cable 846, and may isolate the RF signal on the seventh path 827.

According to an embodiment of the disclosure, the application processor 820 included in the first substrate 840a may detect a voltage at one point 863 of the detection circuit 860, and determine whether a cable is normally coupled based on the detection result. The one point 863 of the detection circuit 860 may be referred to as a point between the resistor 862 and the inductor 864 included in the detection circuit 860. For example, when the detection result exceeds a specified range, the application processor 820 may determine that at least one of the first cable 842, the second cable 844 or the third cable 846 is not normally coupled. As another example, when the detection result does not exceed the specified range, the application processor 820 may determine that the first cable 842, the second cable 844, and the third cable 846 are all normally coupled.

Figure 9:
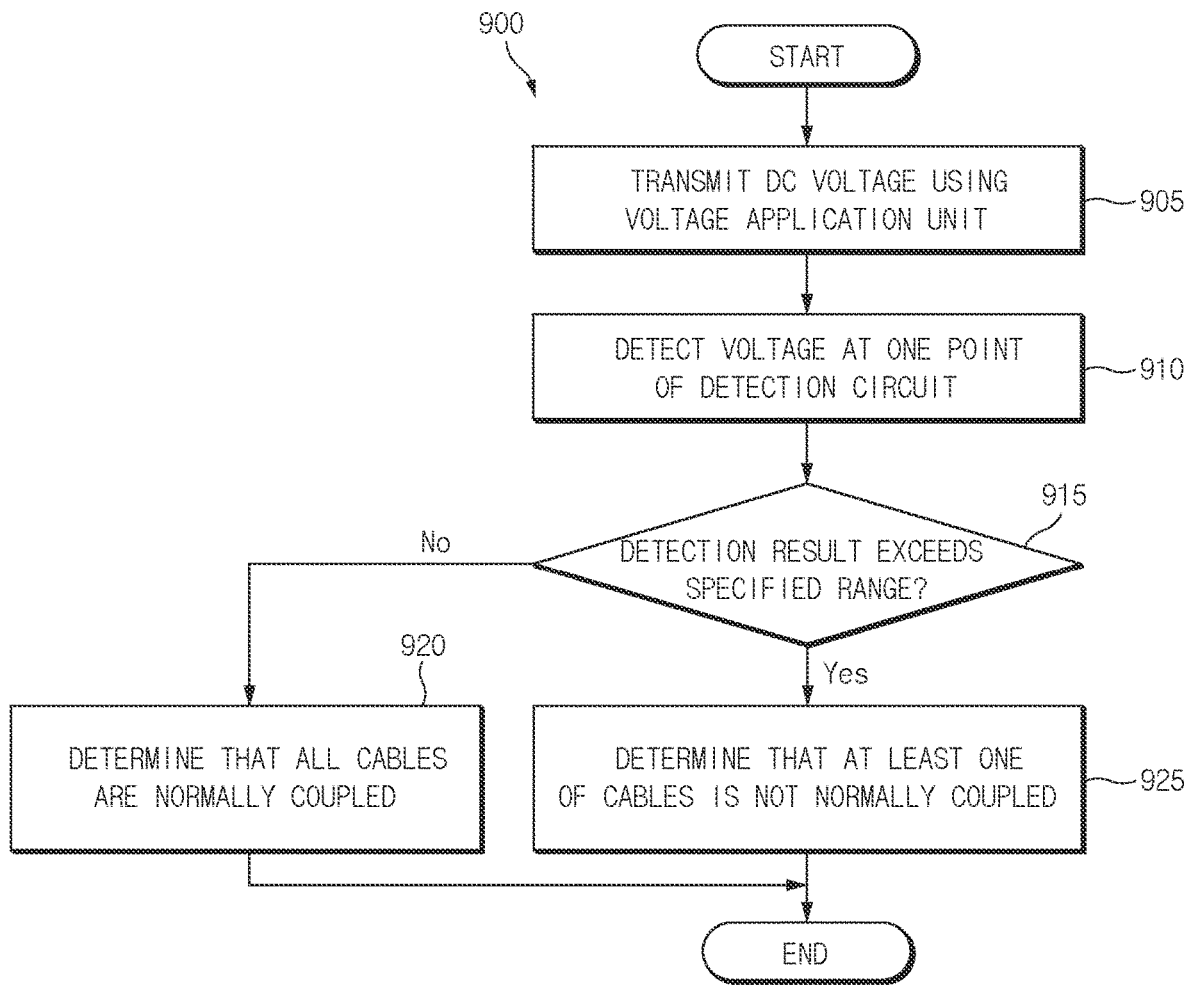
FIG. 9 is a flowchart illustrating an operation of determining a cable is normally coupled by an electronic device according to an embodiment of the disclosure.

FIG. 9 is a flowchart 900 illustrating an operation of determining a cable is normally coupled by an electronic device according to an embodiment of the disclosure.

Referring to FIG. 9, a method of determining whether a cable is normally coupled according to an embodiment may include operations 905 to 925. For example, the operations 905 to 925 may be performed by the electronic device 101 illustrated in FIG. 1. Each of the operations 905 to 925 may be implemented as instructions that may be performed (or executed) by the processor 120 included in the electronic device 101.

According to an embodiment of the disclosure, at operation 905, the electronic device may generate and/or apply a DC voltage by using a voltage application unit (e.g., the voltage application unit 737 of FIG. 7). For example, the DC voltage generated and/or applied by the voltage application unit on the first substrate (e.g., the first substrate 740a of FIG. 7) may be transmitted to a ground unit (e.g., the ground unit 780 of FIG. 7) through a first point (e.g., the first point 701 of FIG. 7), a first cable (e.g., the first cable 742 in FIG. 7), a first isolation circuit (e.g., the first isolation circuit 750 in FIG. 7), a second cable (e.g., the second cable 744 in FIG. 7), and an inductive element (e.g., the inductive element 785 of FIG. 7) sequentially. A first capacitive element arranged on a second substrate (e.g., the second substrate 740b of FIG. 7) may block the DC voltage transmitted from the voltage application unit through the first cable from the first antenna (e.g., the first antenna 770a of FIG. 7). A second capacitive element may block the DC voltage transmitted from the voltage application unit through the first cable and the first isolation circuit sequentially from a second antenna (e.g., the second antenna 770b of FIG. 7). A third capacitive element (e.g., the third capacitive element 775c of FIG. 7) may block the DC voltage transmitted from the voltage application unit through the first cable, the first isolation circuit, and the second cable sequentially from a second communication circuit (e.g., the second communication circuit 710b of FIG. 7). The inductive element may isolate the RF signal between the ground unit and one point between the third point (e.g., the third point 703 of FIG. 7) and the third capacitive element.

At operation 910, the electronic device may detect a voltage at a point of the detection circuit (e.g., the detection circuit 760 of FIG. 7). In other words, the electronic device may obtain information related to the voltage applied to one point of the detection circuit. For example, the detection circuit may include a resistor (e.g., the resistor 762 in FIG. 7) connected in series with the voltage application unit, an inductor (e.g., the inductor 764 in FIG. 7) connected in series with the resistor, and a capacitor (e.g., the capacitor 766 of FIG. 7) connected in parallel to the inductor and connected in series to the first communication circuit (e.g., the first communication circuit 710a of FIG. 7). The electronic device may detect a voltage at one point of the detection circuit by using a processor (e.g., the application processor 720 of FIG. 7). The processor may include an ADC, convert the voltage applied to the one point into a code value by using the ADC, and measure the voltage applied to the one point based on the code value. The one point of the detection circuit may be referred to as a point (e.g., the point 763 of FIG. 7) between the resistor and the inductor.

At operation 915, the electronic device may detect a voltage at one point of the detection circuit, and determine whether the detection result exceeds a specified range. For example, the electronic device may detect the voltage at one point of the detection circuit by using the processor arranged on the first substrate and connected to the detection circuit. The specified range may mean when the voltage at a point included in the detection circuit is 0 V or a value very close to 0 V.

When the detection result does not exceed the specified range (e.g., when the voltage at one point of the detection circuit is 0 V, that is, operation 915—NO), the electronic device may perform operation 920.

When the detection result exceeds the specified range (e.g., when the voltage at one point of the detection circuit exceeds 0 V, that is, operation 915—YES), the electronic device may perform operation 925.

At operation 920, the electronic device may determine that all of the plurality of cables (e.g., the first to third cables 842 to 846 of FIG. 8) are coupled normally. For example, the electronic device may determine that the first cable is normally coupled to the first point and the second point, the second cable is normally coupled to the third point and the fourth point, and the third cable is normally coupled to the fifth point and the sixth point.

According to an embodiment, At operation 925, the electronic device may determine that at least one of the plurality of cables (at least one of the first cable, the second cable or the third cable) is not normally coupled. For example, the electronic device may display a user interface including notification information that at least one of the plurality of cables is not normally coupled on at least one area of a display (e.g., the display module 160 of FIG. 1).

According to various embodiments of the disclosure, the electronic device (e.g., the electronic device 101 of FIG. 1) may include a first substrate (e.g., the first substrate 740a of FIG. 7), a second substrate (e.g., the second substrate 740b of FIG. 7) spaced apart from the first substrate, a first cable (e.g., the first cable 742 of FIG. 7) electrically connecting a first point (e.g., the first point 701 of FIG. 7) on the first substrate and a second point (e.g., the second point 702 of FIG. 7) on the second substrate, and a second cable (e.g., the second cable 744 of FIG. 7) electrically connecting a third point (e.g., the third point 703 of FIG. 7) on the first substrate and a fourth point (e.g., the fourth point 704 of FIG. 7) on the second substrate.

The first substrate may include a first communication circuit (e.g., the first communication circuit 710a in FIG. 7) connected to the first point, a second communication circuit (e.g., the second communication circuit 710b of FIG. 7) connected to the third point, a detection circuit (e.g., the detection circuit 760 of FIG. 7), and a ground unit (e.g., the ground unit 780 of FIG. 7) connected a path between the first point and the first communication circuit through the detection circuit.

The second substrate may include a first antenna (e.g., the first antenna 770a of FIG. 7) electrically connected to the second point 702 through a first path (e.g., the first path 721 of FIG. 7), a first capacitive element (e.g., the first capacitive element 775a of FIG. 7) arranged on the first path, a second antenna (e.g., the second antenna 770b of FIG. 7) electrically connected to the fourth point through a second path (e.g., the second path 722 of FIG. 7), a second capacitive element (e.g., the second capacitive element 775b of FIG. 7) arranged on the second path, and an isolation circuit (e.g., the isolation circuit 750 of FIG. 7) arranged on a third path (e.g., the third path 723 of FIG. 7) between the first and second paths.

The isolation circuit may isolate the RF signal between the first and second paths, and may electrically connect the detection circuit to the ground unit through the first and second cables.

The first substrate may further include a third capacitive element (e.g., the third capacitive element 775c of FIG. 7) arranged on a path between the third point and the second communication circuit, and an inductive element (e.g., the inductive element 785 of FIG. 7) arranged on a path between a point between the third point and the third capacitive element and the ground unit.

The first capacitive element may block the DC voltage transmitted from the voltage application unit through the first cable from the first antenna. The second capacitive element may block the DC voltage transmitted from the voltage application unit through the first cable and the isolation circuit sequentially from the second antenna. The third capacitive element may block the DC voltage transmitted from the voltage application unit through the first cable, the isolation circuit and the second cable sequentially from the second communication circuit. In addition, the inductive element may isolate the RF signal between the ground unit and the one point between the third point and the third capacitive element.

A processor (e.g., the application processor 720 of FIG. 7) connected to the detection circuit may be further included, where the processor may be configured to detect a voltage at a point in the detection circuit and determine that at least one of the first cable or the second cable is not normally coupled when the detection result exceeds a specified range.

The processor may be configured to determine that both the first cable and the second cable are normally coupled when the detection result does not exceed the specified range.

The detection circuit may include a resistor (e.g., the resistor 762 of FIG. 7) connected in series to the voltage application unit, an inductor (e.g., the inductor 764 of FIG. 7) connected in series with the resistor, and a capacitor (e.g., the capacitor 766 in FIG. 7) coupled in parallel to the inductor and connected in series to the first communication circuit. The processor may be configured to detect a voltage at one point (e.g., the point 763 of FIG. 7) between the resistor and the inductor of the detection circuit.

The isolation circuit may include at least one of an inductor and a bead.

At least one of the first cable or the second cable may be a coaxial cable or a flexible printed circuit board (FPCB).

The electronic device may further include a side member and a housing, where the first substrate and the second substrate may be arranged in the housing, and the first antenna and the second antenna may correspond to at least one area of the side member.

The third path may be a path that connects one point between the second point and the first capacitive element to one point between the fourth point and the second capacitive element.

According to various embodiments of the disclosure, an electronic device may include a first substrate, a second substrate spaced apart from the first substrate, a first cable electrically connecting a first point on the first substrate and a second point on the second substrate, a second cable electrically connecting a third point on the first substrate and a fourth point on the second substrate, and a third cable electrically connecting a fifth point on the first substrate and a sixth point on the second substrate.

The first substrate may include a first communication circuit connected to the first point, a second communication circuit connected to the third point, a third communication circuit (e.g., the third communication circuit 810c in FIG. 8) connected to the fifth point, a detection circuit, a voltage application unit connected to a path between the first point and the first communication circuit through the detection circuit, a fourth capacitive element (e.g., the fourth capacitive element 875d of FIG. 8) arranged on a fifth path (e.g., the fifth path 825 of FIG. 8) between the third point and the second communication circuit, a fifth capacitive element (e.g., the fifth capacitive element 875e of FIG. 8) arranged on a sixth path (e.g., the sixth path 826 of FIG. 8) between the fifth point and the third communication circuit, and a second isolation circuit (e.g., the second isolation circuit 850b of FIG. 8) arranged on a seventh path (e.g., the seventh path 827 of FIG. 8) between the fourth and fifth paths.

The second substrate may include a first antenna electrically connected to the second point through a first path (e.g., the first path 821 of FIG. 8), a first capacitive element arranged on the first path, a second antenna electrically connected to the fourth point through a second path (e.g., the second path 822 of FIG. 8), a second capacitive element arranged on the second path, a third antenna electrically connected to the sixth point through a third path (e.g., the third path 823 of FIG. 8), a third capacitive element arranged on the third path, a first isolation circuit arranged on the third path between the first path and the second path, and a ground unit (e.g., the ground unit 880 of FIG. 8) connected to a path between the sixth point and the third capacitive element.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a first substrate;
   a second substrate arranged to be spaced apart from the first substrate;

a first cable electrically connecting a first point on the first substrate and a second point on the second substrate; and
a second cable electrically connecting a third point on the first substrate and a fourth point on the second substrate,
wherein the first substrate includes:
 a first communication circuit connected to the first point,
 a second communication circuit connected to the third point,
 a detection circuit,
 a voltage application unit connected to a path between the first point and the first communication circuit through the detection circuit, and
 a ground unit connected to a path between the third point and the second communication circuit,
wherein the second substrate includes:
 a first antenna electrically connected to the second point through a first path,
 a first capacitive element arranged on the first path, a second antenna electrically connected to the fourth point through a second path,
 a second capacitive element arranged on the second path, and
 an isolation circuit arranged on a third path between the first path and the second path, and
wherein the isolation circuit is configured to:
 isolate a radio frequency (RF) signal between the first path and the second path, and
 electrically connect the detection circuit to the ground unit through the first cable and the second cable.

2. The electronic device of claim 1, wherein the first substrate further includes:
 a third capacitive element arranged on the path between the third point and the second communication circuit, and
 an inductive element arranged on a path between one point between the third point and the third capacitive element and the ground unit.

3. The electronic device of claim 2,
wherein the first capacitive element is configured to block a direct current (DC) voltage transmitted from the voltage application unit through the first cable from the first antenna,
wherein the second capacitive element is configured to block a DC voltage transmitted from the voltage application unit through the first cable and the isolation circuit sequentially from the second antenna,
wherein the third capacitive element is configured to block a DC voltage transmitted from the voltage application unit through the first cable, the isolation circuit and the second cable sequentially from the second communication circuit, and
wherein the inductive element is configured to isolate an RF signal between the ground unit and the one point between the third point and the third capacitive element.

4. The electronic device of claim 1, further comprising:
a processor connected to the detection circuit,
wherein the processor is configured to:
 detect a voltage at one point of the detection circuit, and determine that at least one of the first cable or the second cable is not normally coupled when the detected voltage exceeds a specified range.

5. The electronic device of claim 4, wherein the processor is further configured to determine that both the first cable and the second cable are normally coupled when the detection result does not exceed the specified range.

6. The electronic device of claim 4,
wherein the detection circuit includes:
 a resistor connected in series with the voltage application unit,
 an inductor connected in series with the resistor, and
 a capacitor connected in parallel with the inductor and connected in series with the first communication circuit, and
wherein the processor is further configured to detect a voltage at one point between the resistor and the inductor of the detection circuit.

7. The electronic device of claim 1, wherein the isolation circuit includes at least one of an inductor or a bead.

8. The electronic device of claim 1, wherein at least one of the first cable and the second cable includes a coaxial cable or a flexible printed circuit board (FPCB).

9. The electronic device of claim 1, further comprising:
a side member; and
a housing,
wherein the first substrate and the second substrate are arranged in the housing, and
wherein the first antenna and the second antenna correspond to at least one area of the side member.

10. The electronic device of claim 1, wherein one point between the second point and the first capacitive element is connected to one point between the fourth point and the second capacitive element through the third path.

11. An electronic device comprising:
a first substrate;
a second substrate arranged to be spaced apart from the first substrate;
a first cable electrically connecting a first point on the first substrate and a second point on the second substrate;
a second cable electrically connecting a third point on the first substrate and a fourth point on the second substrate; and
a third cable electrically connecting a fifth point on the first substrate and a sixth point on the second substrate,
wherein the first substrate includes:
 a first communication circuit connected to the first point,
 a second communication circuit connected to the third point,
 a third communication circuit connected to the fifth point,
 a detection circuit,
 a voltage application unit connected to a path between the first point and the first communication circuit through the detection circuit,
 a fourth capacitive element arranged on a fifth path between the third point and the second communication circuit,
 a fifth capacitive element arranged on a sixth path between the fifth point and the third communication circuit, and
 a second isolation circuit arranged on a seventh path between the fifth path and the sixth path,
wherein the second substrate includes:
 a first antenna electrically connected to the second point through a first path,
 a first capacitive element arranged on the first path,
 a second antenna electrically connected to the fourth point through a second path,
 a second capacitive element arranged on the second path, a third antenna electrically connected to the sixth point through a third path, a third capacitive element arranged on the third path, a first isolation circuit arranged on a fourth path between the first path and the second path, and a ground unit connected to a path between the sixth point and the third capacitive element, wherein the first isolation circuit is configured to isolate an RF signal between the first path and the second path, and wherein the second isolation circuit electrically connects the detection circuit to the ground unit through the first cable, the second cable and the third cable and is configured to isolate an RF signal between the fifth path and the sixth path.

12. The electronic device of claim 11, wherein the second substrate further includes an inductive element arranged on a path between one point between the sixth point and the third capacitive element and the ground unit.

13. The electronic device of claim 12, wherein the first capacitive element is configured to block a DC voltage transmitted from the voltage application unit through the first cable from the first antenna, wherein the second capacitive element is configured to block a DC voltage transmitted from the voltage application unit through the first cable and the first isolation circuit sequentially from the second antenna, wherein the third capacitive element is configured to block a DC voltage transmitted from the voltage application unit through the first cable, the first isolation circuit, the second cable, the second isolation circuit and the third cable sequentially from the third antenna, wherein the fourth capacitive element is configured to block a DC voltage transmitted from the voltage application unit through the first cable, the first isolation circuit and the second cable sequentially from the second communication circuit, wherein the fifth capacitive element is configured to block a DC voltage transmitted from the voltage application unit through the first cable, the first isolation circuit, the second cable and the second isolation circuit sequentially from the third communication circuit, and wherein the inductive element is configured to isolate an RF signal between the one point between the sixth point and the third capacitive element and the ground unit.

14. The electronic device of claim 11, further comprising: at least one processor connected to the detection circuit, wherein the at least one processor is configured to:

detect a voltage at one point of the detection circuit, and determine that at least one of the first cable, the second cable or the third cable is not normally coupled when the detected voltage exceeds a specified range.

15. The electronic device of claim 14, wherein the at least one processor is further configured to determine that the first cable, the second cable and the third cable are all normally coupled when the detection result does not exceed the specified range.

* * * * *